(12) United States Patent
Holmes et al.

(10) Patent No.: US 6,780,736 B1
(45) Date of Patent: Aug. 24, 2004

(54) METHOD FOR IMAGE REVERSAL OF IMPLANT RESIST USING A SINGLE PHOTOLITHOGRAPHY EXPOSURE AND STRUCTURES FORMED THEREBY

(75) Inventors: Steven J. Holmes, Wappingers Falls, NY (US); Toshiharu Furukawa, Essex Junction, VT (US); Arpan P. Mahorowala, Bronxville, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,009

(22) Filed: Jun. 20, 2003

(51) Int. Cl.[7] .............................. H01L 21/425
(52) U.S. Cl. ................. 438/514; 438/515; 438/527
(58) Field of Search ....................... 438/514, 515, 438/527

(56) References Cited

U.S. PATENT DOCUMENTS

| | | | | |
|---|---|---|---|---|
| 4,564,584 A | * | 1/1986 | Fredericks et al. | 430/312 |
| 5,266,505 A | * | 11/1993 | Ahlgren et al. | 438/373 |
| 5,306,390 A | * | 4/1994 | Peek | 438/524 |
| 6,015,991 A | * | 1/2000 | Wheeler et al. | 257/336 |
| 6,221,562 B1 | | 4/2001 | Boyd et al. | |
| 6,309,975 B1 | * | 10/2001 | Wu et al. | 438/705 |
| 6,358,856 B1 | | 3/2002 | Lyons et al. | |
| 6,372,412 B1 | | 4/2002 | Hakey et al. | |
| 6,448,164 B1 | | 9/2002 | Lyons et al. | |
| 6,489,191 B2 | | 12/2002 | Shao et al. | |
| 6,503,689 B2 | * | 1/2003 | Zampini et al. | 430/270.1 |
| 6,562,547 B2 | * | 5/2003 | Kraft et al. | 430/314 |
| 6,599,680 B2 | * | 7/2003 | Lin | 430/314 |
| 2002/0172896 A1 | * | 11/2002 | Adams et al. | 430/322 |

* cited by examiner

*Primary Examiner*—T. N. Quach
(74) *Attorney, Agent, or Firm*—Todd M. C. Li; Cantor Colburn LLP

(57) ABSTRACT

A method for image reversal in semiconductor processing includes forming a first implant mask layer upon a semiconductor substrate and forming a patterned photoresist layer over the first implant mask layer. Portions of the first implant mask layer not covered by the patterned photoresist layer are removed so as to expose non-patterned portions of the substrate. The photoresist layer is then removed, and a second implant mask layer is formed over the non-patterned portions of the substrate, wherein the first implant mask layer has an etch selectivity with respect to the second implant mask layer. The remaining portions of the first implant mask layer are removed to expose a reverse image of the substrate, including initially patterned portions of the substrate.

12 Claims, 4 Drawing Sheets

METHOD FOR IMAGE REVERSAL OF IMPLANT RESIST USING A SINGLE PHOTOLITHOGRAPHY EXPOSURE AND STRUCTURES FORMED THEREBY

BACKGROUND OF INVENTION

The present invention relates generally to semiconductor device manufacturing and, more particularly, to a method for image reversal of implant resist using a single photolithography exposure and structures formed thereby.

The manufacturing of semiconductor devices is dependent upon the accurate replication of computer aided design (CAD) generated patterns onto the surface of a device substrate. The replication process is typically performed using lithographic processes, followed by a variety of subtractive (etch) and additive (deposition) processes. More particularly, a photolithography process typically includes applying a layer of a photoresist material (i.e., a material that will react when exposed to light), and then selectively exposing portions of the photoresist to light or other ionizing radiation (e.g., ultraviolet, electron beams, X-rays, etc.), thereby changing the solubility of portions of the material. The resist is then developed by washing it with a basic developer solution, such as tetramethylammonium hydroxide (TMAH), thereby removing the non-irradiated (in a negative resist) or irradiated (in a positive resist) portions of the resist layer.

In the fabrication of complementary metal oxide semiconductor (CMOS) devices, several implant masks are used to form appropriate source and drain areas on the chip. For p-type and n-type CMOS devices NFETs, PFETs), some of these patterns are complementary; that is, the pattern used for creating the p-type devices is the reverse of the pattern used for creating the n-type devices. More specifically, two separate masks are used in CMOS device processing in which either a positive or negative resist is used to carry out two separate, complementary masking and implanting steps. For example, a first implant pattern is formed by creating a first patterned (positive or negative) photoresist layer over a substrate. A first ion implantation is used to implant the exposed areas of the substrate with a first dopant material (e.g., a p-type material). Subsequently, the first patterned layer is stripped and a second pattered resist (of the same tone as the first resist) is used to expose the complementary regions of the substrate regions in order to carry out the complementary implantation with a second dopant material (e.g., an n-type material).

However, as devices become even more miniaturized over time, the conventional methods for complementary device implantation are more susceptible to alignment errors as a result of the separate masking steps. Such alignment errors would limit the density and performance of the resulting devices. These alignment errors may include rotation errors, translation errors, overlap errors, and/or image size deviations. In turn, the possibility of incurring one or more of these errors results in the increase of the overall device error placement budget, thereby reducing valuable chip real estate that would otherwise be used for additional devices.

An image reversal process is another known technique used in CMOS device processing, in which a combination of positive and negative resists is used for such steps as gate/line patterning or contact hole patterning. In one approach, a positive photoresist layer formed over a substrate is patterned to create an opening for a gate pattern or a line pattern. Subsequently, a negative resist is formed over the irradiated positive photoresist, including the formed opening. Then, the negative resist is recessed such that it remains only in the area defined by the opening formed in the positive resist layer, while the remaining positive resist is removed. The remaining hardened negative resist defines the location for the gate or line pattern.

Although this type of image reversal process may be used to form certain types of semiconductor structures, it is not particularly suited for the type of complementary implant regions discussed above, due to intermixing between negative and positive photoresists during apply. The intermixing will cause deformation of the underlying first resist pattern, impacting line width control and causing residual resist defects. Moreover, even if this approach were able to be adapted for complementary device implantation, there are still two separate lithography steps needed in accomplishing the image reversal.

Another existing approach is to utilize spun-on glass (SOG) over photoresist for image reversal purposes. However, SOG is an oxide material that is typically removed using harsh solvents such as dilute HF or buffered HF, and which in turn tends to cause damage to the other oxide layers on the device substrate.

Unfortunately, a significant part of the cost of an integrated circuit chip is contained in the lithography processes used to pattern these implant mask levels. As such, it would be desirable to be able to implement image reversing for applications such as CMOS device implantation, but without the added lithography step used heretofore (or the added risk of device damage in removing SOG) to accomplish the image reversal.

SUMMARY OF INVENTION

The foregoing discussed drawbacks and deficiencies of the prior art are overcome or alleviated by a method for image reversal in semiconductor processing. In an exemplary embodiment, the method includes forming a first implant mask layer upon a semiconductor substrate and forming a patterned photoresist layer over the first implant mask layer. Portions of the first implant mask layer not covered by the patterned photoresist layer are removed so as to expose non-patterned portions of the substrate. The photoresist layer is then removed, and a second implant mask layer is formed over the non-patterned portions of the substrate, wherein the first implant mask layer has an etch selectivity with respect to the second implant mask layer. The remaining portions of the first implant mask layer are removed to expose a reverse image of the substrate, including initially patterned portions of the substrate.

In another aspect, a method for implementing image reversal for semiconductor device implantation includes forming a first implant mask layer upon a semiconductor substrate and forming a patterned photoresist layer over the first implant mask. Portions of the first implant mask layer not covered by the patterned photoresist layer are removed so as to expose non-pattered portions of the substrate. The photoresist layer is removed, and the exposed, non-pattered portions of the substrate are subjected to a first implantation. A second implant mask layer is then formed over the non-patterned portions of the substrate, wherein the first implant mask layer has an etch selectivity with respect to the second implant mask layer. The remaining portions of the first implant mask layer are removed to expose a reverse image of the substrate, including initially patterned portions of the substrate. The exposed initially patterned portions of the substrate are then subjected to a second implantation.

In still another aspect, a semiconductor device has a first implant region having a first conductivity type and a second implant region having a second conductivity type, wherein the first and said second implant regions are self-aligned with respect to one another.

BRIEF DESCRIPTION OF DRAWINGS

Referring to the exemplary drawings wherein like elements are numbered alike in the several Figures.

DETAILED DESCRIPTION

Disclosed herein is a non-lithographic process used to reverse the tone of an implant pattern formed on a semiconductor substrate, thereby allowing a single lithography exposure to serve as a template for two different implant masking steps. This process, in turn, may be utilized to form semiconductor devices (such as CMOS devices) having self-aligned, complementary implant regions that allow for tighter alignment tolerances and greater chip real estate savings.

Figure 1A:
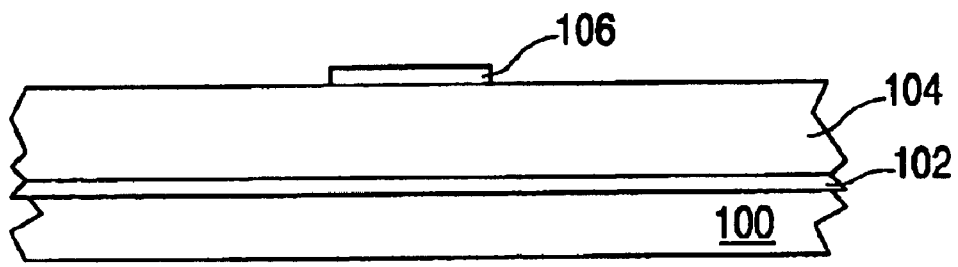
FIGS. 1(a)–1(h) illustrate a method for image reversal of an implant resist, in accordance with an embodiment of the invention.

Referring generally to FIGS. 1(a)–1(h), there is shown a method for image reversal in semiconductor processing, in accordance with an embodiment of the invention. In particular, FIG. 1(a) illustrates a semiconductor substrate 100, such as silicon. It will be noted that the substrate 100 is intended to include other features (not shown for purposes of clarity), such as a shallow trench isolation region (STI), silicon-on-insulator (SOI), SiGe structures, and the like. The substrate 100 is coated with an optional etch stop layer (e.g., a thin layer of organic antireflective coating (ARC)) 102 thereupon, followed by a first implant mask layer 104 (e.g., of silicon ARC (Si-ARC), which is commercially available, for example, from Shin-Etsu). Additional details regarding Si-ARC may be found in U.S. patent application Ser. No. 10/124,087, filed Apr. 16, 2002 (and assigned to the assignee of the present application), the contents of which are incorporated herein by reference in their entirety.

The first implant mask layer 104 is chosen to be thick enough and to have sufficient stopping power to stop a subsequent implant from entering the substrate 100. Suitable materials for the first implant mask layer 104 should have good selectivity (i.e., a higher etch rate) relative to an overlying resist layer and the underlying etch stop layer 102. Etch processes for the implant mask layer 104, such as fluorine or fluorine/oxygen mixture plasmas, tend to damage the substrate Therefore, the etch stop layer 102 is provided directly on the substrate surface 100 to provide protection for the substrate surface during the etch of the implant mask layer (e.g., Si-ARC) 104.

During the patterned etch of the first implant mask layer 104, the etch stop layer 102 should etch at a significantly slower rate than the first implant mask layer 104. Thus, one suitable etch stop layer 102 may be an organic polymer like the deep ultraviolet (DUV) ARC, such as those made available from Brewer Science or Shipley. For example, an organic ARC for 193 nanometer (nm) lithography, such as that supplied by Shipley, would be applied at a thickness in the range of from about 40 nm to about 100 nm, depending on the thickness of the overlying implant mask layer 104 and the selectivity of the etch process. In this embodiment, Si-ARC is a suitable implant mask layer material, which may be applied at a thickness of about 150 nm to about 400 nm, and more preferably at about 190 nm.

Then, a photoresist layer, which may include any resist that has a good etch rate relative to the first implant mask layer 104 (e.g., the Si-ARC layer in the illustrated embodiment), is applied over the first mask implant layer 104 using standard post-apply and post-expose bakes as recommended by the supplier. The thickness of the resist layer 106 is preferably in the range of about 50–300 nm, and more preferably from about 120–160 nm. Thereafter, the resist layer is lithographically patterned and exposed. The remaining patterned resist 106 is shown in FIG. 1(a).

Figure 1B:
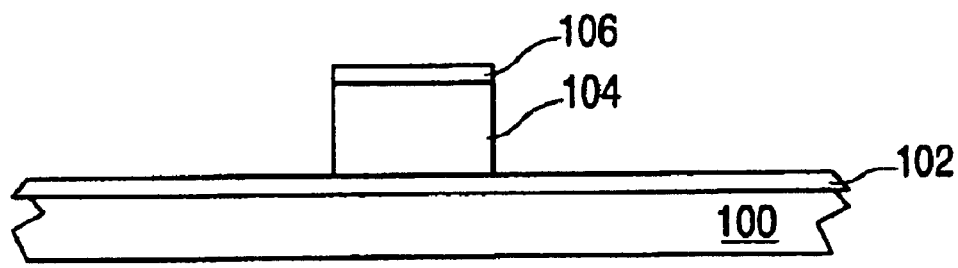

Next, as illustrated in FIG. 1(b), the exposed areas of the implant mask (e.g., Si-ARC) layer 104 are removed through etching in a plasma reactive ion etch (RIE), such as, but not limited to, a fluorine plasma or fluorine/oxygen plasma, as well known in the art. The selectivity of the etch of the first implant mask layer 104 relative to the patterned resist layer 106 is high, wherein (for example) only about 20 nm of resist 106 is consumed while the exposed areas of the implant mask layer 104 is preferably completely consumed. If the optional organic ARC layer 102 is used, then the etch is terminated thereupon so as to avoid damage to the substrate 100. The organic ARC layer 102 may then be removed with a brief RIE process, for example using mixtures of oxygen, argon, nitrogen, or more preferably $O_2$, during which the remaining resist layer 106 over the patterned etch stop layer 102 (e.g., Si-ARC) may also be removed.

Figure 1C:
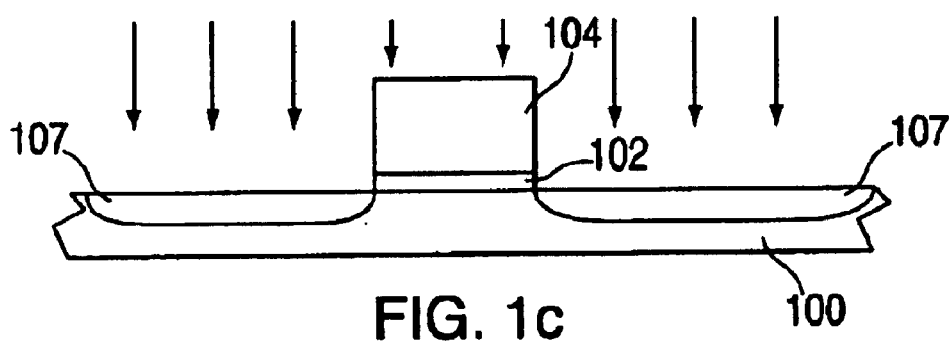
Figure 1D:
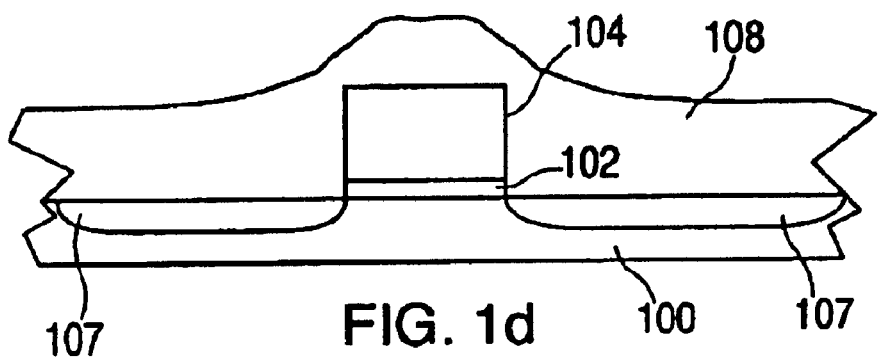

At this point, the patterned substrate 100 is ready for a first implantation process. Thus, for example, in CMOS device processing, a dopant material(s) (e.g., arsenic, boron, phosphorous, etc.) may be implanted by standard techniques. An angled implant may be performed at some angle with respect to the substrate surface or, as shown in FIG. 1(c), the implant may be orthogonal to the substrate 100. This results in a first implant region 107, as illustrated in FIG. 1(d).

Once the first implant region 107 is complete, the substrate 100 is then ready for the image reversal process, which will allow a second implant to be performed for the complementary substrate areas previously protected by the first implant mask (e.g., Si-ARC) layer 104. Prior thereto, the first implant mask Si-ARC layer 104 (and any remaining resist material thereon) may be ultraviolet (UV) hardened. As shown in FIG. 1(d), a second implant mask layer 108 is applied over the substrate. The second implant mask layer 108 may be a polyimide that is compatible with CMP processing and has a low etch rate relative to the first implant mask layer 104. Other suitable materials for the second implant mask layer 108 include organic ARC materials, such as the ARC used for the etch stop layer 102. Such an organic film may be spin applied to the substrate and over the existing patterned first implant mask layer 104, and may further be thermally cross-linked so as to harden the second implant mask layer 108 for subsequent chemical mechanical polishing (CMP) processes.

Figure 1E:
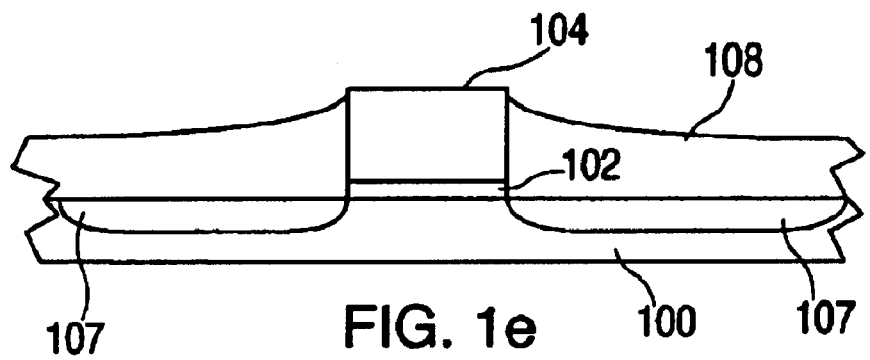

The second implant mask layer (e.g., an organic film layer) 108, is preferably applied to cover the first implant mask layer 104, for example at a thickness in the range of about 200 to about 450 nm. After the spin on application, the organic layer 108 is thermally cured by baking and is thereby cross-linked. Then, as shown in FIG. 1(e), the excess portions of second implant mask layer (e.g., the cross-linked organic layer) 108 are removed (by CMP, for example) so as to expose the top surface of the first implant mask (e.g., Si-ARC) layer 104.

Figure 1F:
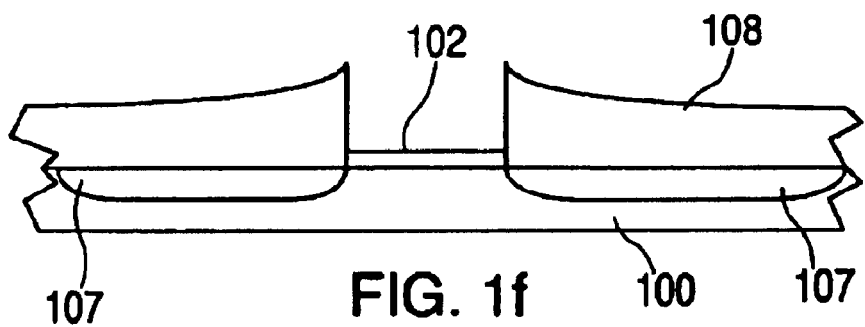
Figure 1G:
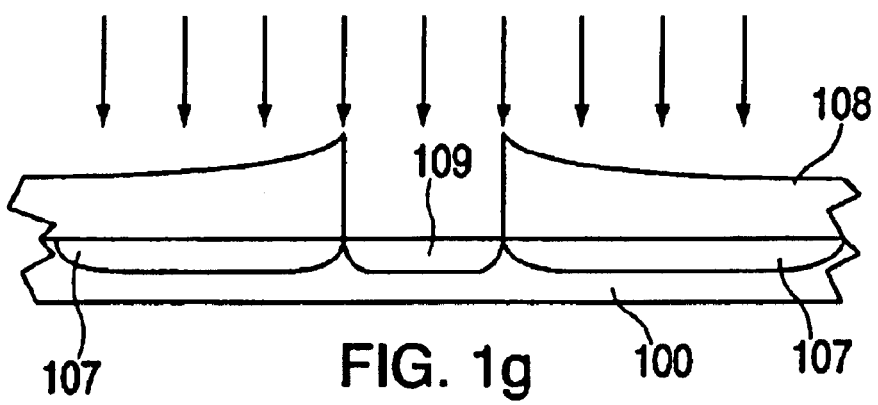
Figure 1H:
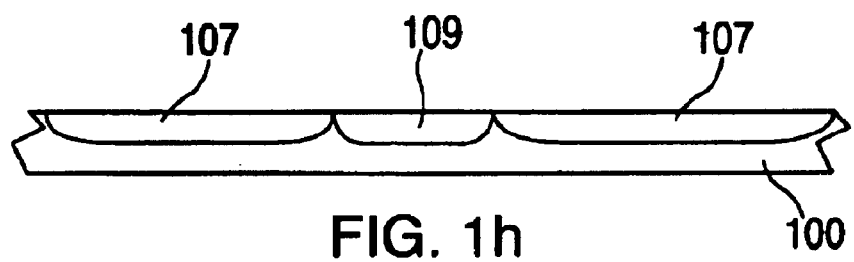

In FIG. 1(f), the initially patterned Si-ARC layer 104 is then removed using the same or similar fluorine plasma RIE process used in removing the unpatterned Si-ARC areas, using a RIE process that etches the first implant mask layer 104 preferably to the second implant mask (e.g., organic film) layer 108, thereby leaving most of the organic ARC film layer 108 in place. For example, after polishing and etching, there may be about 100–350 nm of the second implant mask layer 108 (e.g., organic ARC) remaining on the bulk of the substrate surface. For example, in FIG. 1(g), the exposed protective etch stop layer (e.g., organic ARC) 102 has been removed with an oxygen RIE, as in the initial implant process described above. At this point, there may be about 50–300 nm of the second implant mask layer (e.g., organic ARC) remaining to serve as a mask for the complementary implant, which forms the second implant region 109, as also illustrated in FIG. 1(g). The second implant region 109 may be different from the first implant region 107. Finally, as shown in FIG. 1(h), the remaining organic ARC mask layer 108 is stripped, leaving the substrate 100 with the completed, complementary dopant implant regions 107, 109.

For N-well and P-well structures, relatively deeper implants are required, for example, up to about 1–2 microns, so that the thicknesses for the etch stop 102, the first implant mask 104, and the resist layer 106 would be thicker in order to block the deeper implants in regions where implants are not desired. The second implant mask layer 108 would also be correspondingly thicker for such structures.

Depending on the particular application of the single lithography image reversal process, other materials may be substituted and/or omitted for one or more of the process steps described above. For example, if the desired implant patterns are all relatively narrow (e.g., having a height to width aspect ratio of about 2:1 or more), it might be possible to avoid a CMP step and use a resist develop process to remove the second organic ARC masking layer 108 from the top of the first implant mask 104 Si-ARC patterns. This is possible because for high aspect ratio features, the spin-on layer 108 would tend to be thinner on top of the high aspect ratio features 104 than within the gaps. For example, a developable ARC could be applied to the substrate to form the second implant masking layer 108, and could be removed from the top of the first implant mask layer 104 by a developer solution, as illustrated in FIG. 1(e).

In addition to Si-ARC, it is also contemplated that other hard mask materials (such as silicon oxide, SOG, silicon nitride, SiGe oxide/nitride, at about 100 nm in thickness) may be substituted for the first implant mask layer 104. Generally, however, such materials are somewhat less desirable due to a lower etch selectivity with respect to resist and ARC materials.

Figure 2A:
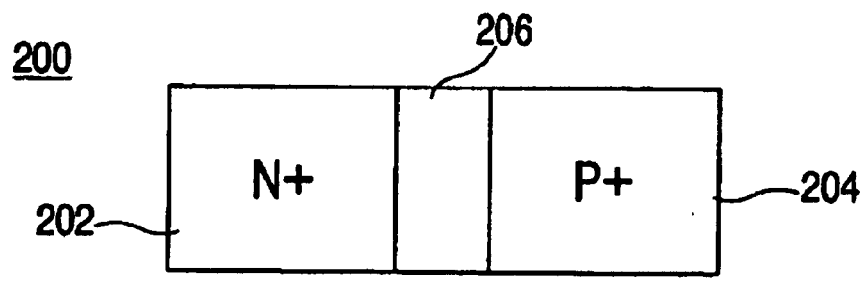
FIGS. 2(a)–2(e) illustrates examples of semiconductor devices with complementary implant regions having one or more alignment errors associated therewith.
Figure 2B:
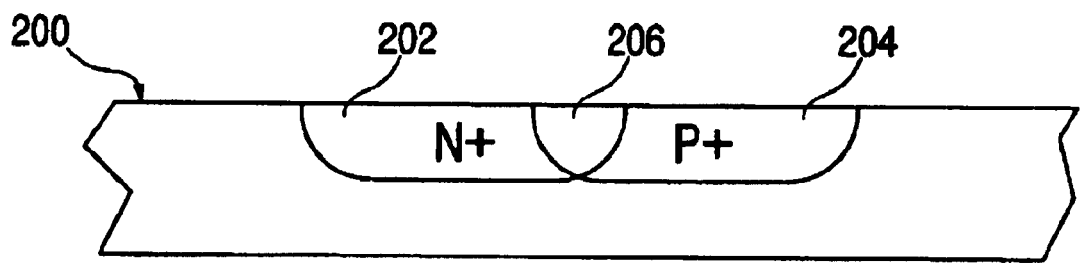

Furthermore, in addition to reducing the cost associated with an additional lithography step, the present image reversal process may be used to form self-aligned masks and thus self-aligned semiconductor devices with complementary implant regions. FIGS. 2(a)–2(e) illustrate examples of devices featuring butted junctions (i.e., adjacently disposed n-well and p-well regions) having one or more alignment errors associated therewith. For example, FIGS. 2(a) and 2(b) are a top view and side cross-sectional view, respectively, of a conventionally formed device 200 wherein an N+ region 202 and P+ region 204 overlap one another at region 206. This misalignment has the undesired effect of lowering the device breakdown voltage.

Figure 2C:
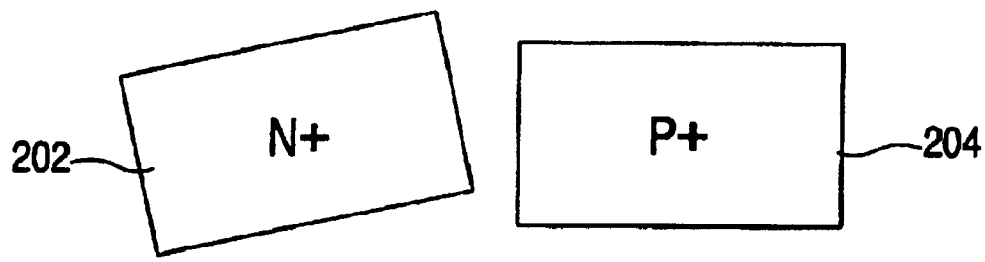
Figure 2D:
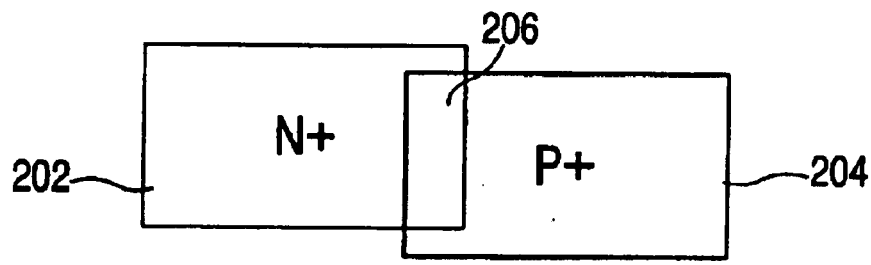
Figure 2E:
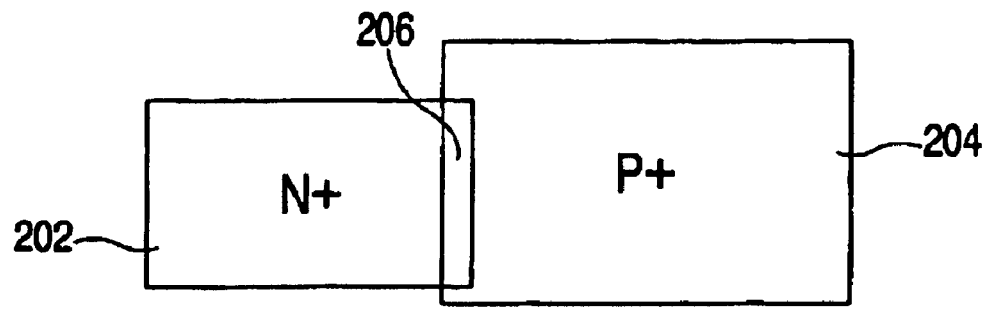

FIG. 2(c) illustrates an alignment rotation error with respect to N+ region 202 and P+ region 204, while FIG. 2(d) illustrates an alignment translation error in addition to an overlap error. Still another example is shown in FIG. 2(e), which illustrates an image size deviation of the P+ region 204, as well as translation and overlap errors.

Figure 3A:
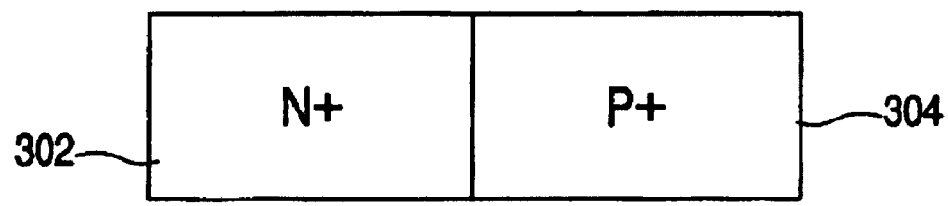
FIGS. 3(a) and 3(b) illustrate a semiconductor device having self-aligned, complementary implant regions formed using the methods of FIG. 1(a)–1(h), in accordance with a further embodiment of the invention.
Figure 3B:
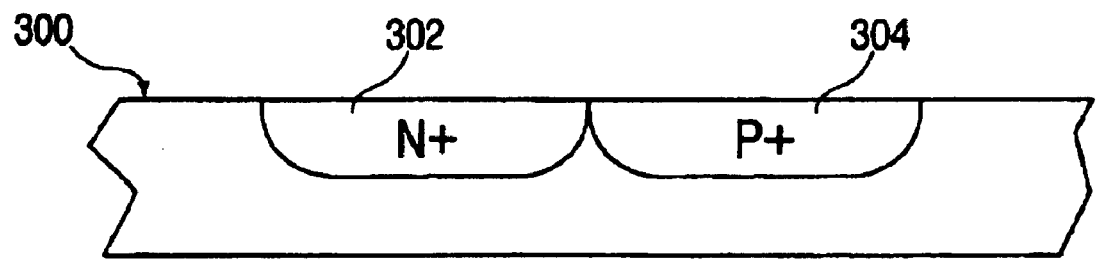

Accordingly, FIGS. 3(a) and 3(b) illustrate an exemplary semiconductor device 300 having self-aligned, complementary implant regions, in accordance with a further aspect of the present invention can be seen, the use of the image reversal process described above allows for a tightly controlled offset between different implant regions, which has the desired effect of controlling the breakdown voltage of the device 300, especially for butted junction devices. This in turn reduces the overall error placement budget, saving additional valuable chip real estate for additional devices.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for image reversal in semiconductor processing, the method comprising:

forming a first implant mask layer upon a semiconductor substrate, wherein said first implant mask layer comprises a silicon antireflective coating layer;

forming a patterned photoresist layer over said first implant mask layer;

removing portions of said first implant mask layer not covered by said patterned photoresist layer so as to expose non-patterned portions of said substrate;

removing said photoresist layer;

forming a second implant mask layer over said non-patterned portions of said substrate, wherein said first implant mask layer has an etch selectivity with respect to said second implant mask layer; and removing the remaining portions of said first implant mask layer to expose a reverse image of said substrate, comprising initially patterned portions of said substrate.

2. The method of claim 1, wherein said silicon antireflective coating layer is formed upon an etch stop layer initially formed upon said substrate.

3. The method of claim 2, wherein said etch stop layer further comprises a first organic antireflective coating layer, and said second implant mask layer further comprises a second organic antireflective coating layer.

4. The method of claim 3, wherein said second organic antireflective coating layer is applied in a spin-on fashion and thermally cross-linked.

5. The method of claim 4, further comprising removing a portion of said second organic antireflective coating by chemical mechanical polishing so as to expose a top surface of silicon antireflective coating.

6. The method of claim 1 wherein removal of said silicon antireflective coating is implemented with a fluorine plasma reactive ion etch.

7. A method for implementing image reversal for semiconductor device implantation, the method comprising:

forming a first implant mask layer upon a semiconductor substrate, wherein said first implant mask layer comprises a silicon antireflective coating layer;

forming a patterned photoresist layer over said first implant mask layer;

removing portions of said first implant mask layer not covered by said patterned photoresist layer so as to expose non-patterned portions of said substrate;

removing said photoresist layer;

subjecting said exposed non-patterned portions of said substrate to a first implantation;

forming a second implant mask layer over said non-patterned portions of said substrate, wherein said first implant mask layer has an etch selectivity with respect to said second implant mask layer;

removing the remaining portions of said first implant mask layer to expose a reverse image of said substrate, comprising initially patterned portions of said substrate; and subjecting said exposed initially patterned portions of said substrate to a second implantation.

8. The method of claim 7, wherein said silicon antireflective coating layer is formed upon an etch stop layer initially formed upon said substrate.

9. The method of claim 8, wherein said etch stop layer further comprises a first organic antireflective coating layer, and said second implant mask layer further comprises a second organic antireflective coating layer.

10. The method of claim 9, wherein said second organic antireflective coating layer is applied in a spin-on fashion and thermally cross-linked.

11. The method of claim 10, further comprising removing a portion of said second organic antireflective coating by chemical mechanical polishing so as to expose a top surface of silicon antireflective coating.

12. The method of claim 7 wherein removal of said silicon antireflective coating is implemented with a fluorine plasma reactive ion etch.

* * * * *